(12) United States Patent
Sun

(10) Patent No.: US 9,006,059 B2
(45) Date of Patent: Apr. 14, 2015

(54) CMOS TRANSISTOR AND METHOD FOR FABRICATING THE SAME

(71) Applicant: Boe Technology Group Co., Ltd., Beijing (CN)

(72) Inventor: Bing Sun, Beijing (CN)

(73) Assignee: Boe Technology Group Co., Ltd, Beijing (CN)

( * ) Notice: Subject to any disclaimer, the term of this patent is extended or adjusted under 35 U.S.C. 154(b) by 35 days.

(21) Appl. No.: 14/019,724

(22) Filed: Sep. 6, 2013

(65) Prior Publication Data

US 2014/0087532 A1    Mar. 27, 2014

(30) Foreign Application Priority Data

Sep. 26, 2012   (CN) .......................... 2012 1 0365313

(51) Int. Cl.
*H01L 21/8238* (2006.01)
*H01L 29/786* (2006.01)
*H01L 27/12* (2006.01)

(52) U.S. Cl.
CPC .. *H01L 21/823807* (2013.01); *H01L 29/78621* (2013.01); *H01L 27/1288* (2013.01)

(58) Field of Classification Search
None
See application file for complete search history.

(56) References Cited

U.S. PATENT DOCUMENTS

| 6,071,796 A * | 6/2000 | Voutsas .......................... 438/487 |
| 2005/0142702 A1 | 6/2005 | Ohnuma et al. |
| 2009/0236605 A1* | 9/2009 | Qiu et al. ......................... 257/72 |

FOREIGN PATENT DOCUMENTS

| CN | 1670915 A | 9/2005 |
| JP | 2005-093639 A | 4/2005 |

OTHER PUBLICATIONS

First Chinese Office Action dated Feb. 27, 2014; Appl. No. 201210365313.8
Second Chinese Office Action Issued Jul. 1, 2014; Appln No. 201210365313.8.

* cited by examiner

*Primary Examiner* — Yasser A Abdelaziez
(74) *Attorney, Agent, or Firm* — Ladas & Parry LLP

(57) ABSTRACT

The invention provides a method for fabricating a CMOS transistor and a method for fabricating an array substrate. The method for fabricating a CMOS transistor comprises a step of forming channels, which comprises: depositing an amorphous silicon layer on a substrate, and crystallizing the amorphous silicon layer into a poly-silicon layer; implanting boron atoms into the poly-silicon layer and then forming an N channel region and a P channel region by etching the poly-silicon layer implanted with the boron atoms; forming a photoresist-partially-retained region corresponding to the N channel region and a photoresist-completely-retained region corresponding to the P channel region through a single patterning process; and removing the photoresist in the photoresist-partially-retained-region and retaining a part of the photoresist in the photoresist-completely-retained region using an ashing process, implanting phosphorus atoms through ion implantation thereby forming an N channel and a P channel.

15 Claims, 4 Drawing Sheets

B implantation

P implantation

P implantation (N-)

CMOS TRANSISTOR AND METHOD FOR FABRICATING THE SAME

FIELD OF THE ART

Embodiments of the invention relate to the field of Low Temperature Poly-silicon (LTPS) display, more particularly, to a CMOS transistor and a method for fabricating the same.

BACKGROUND

The driving IC and the glass substrate of conventional amorphous silicon LCD displays are designed as non-integrated discrete components, thus a lot of connectors are required between the driving IC and the glass substrate. Generally, an amorphous silicon LCD panel requires as many as 4,000 connectors, which inevitably makes the structure complex and the cost for fabricating the module high; moreover, the stability of such a panel is low and failure rate is high. Meanwhile, with the discrete design of the driving IC and the glass substrate, it is difficult to make the LCD lightweight and thin any further, which is a severe impact on lightweight notebook PC and tablet PC. In contrast, Low Temperature Poly-silicon (LTPS) technology does not suffer such disadvantage; the driving IC and the glass substrate may be integrated directly and the number of the required connectors is dramatically decreased to below 200, with the total number of elements in the display reduced by 40% in comparison with conventional a-Si technology. As a result, the structure of the panel is rendered simple while the stability is improved. In theory, fabrication cost of poly-silicon LCD panel is also lower than conventional technologies. Meanwhile, the integrated structure saves the additional space required by the driving IC and the LCD display panel can therefore be made lighter and thinner.

LTPS is a branch of poly-silicon technology. As far as LCD display is concerned, it brings a lot of advantages, such as the thin film circuit may be made thinner and smaller and the power consumption may be lower, to use the poly-silicon liquid crystal material.

LTPS semiconductor has a relative high mobility and can be used to form CMOS semiconductor devices, therefore, it can be applied to highly integrated TFT-LCDs and AMOLED with high aperture rate.

However, LIPS CMOS suffers from high cost due to its complicated processes.

SUMMARY

An aspect of the invention provides a method for fabricating a CMOS transistor comprising: forming channels, a gate electrode, ohmic contact layers and a source and drain electrodes on a substrate, wherein forming channels comprises:

forming an amorphous silicon layer on the substrate, and crystallizing the amorphous silicon layer into a poly-silicon layer;

implanting boron atoms into the poly-silicon layer;

forming a photoresist-partially-retained region corresponding to an N channel region and a photoresist-completely-retained region corresponding to a P channel region on the poly-silicon layer implanted with the boron atoms through a single patterning process; and removing the photoresist in the photoresist-partially-retained-region and retaining a part of the photoresist in the photoresist-completely-retained region using an ashing process, implanting phosphorus atoms through ion implantation, thereby forming an N channel in the N channel region and forming a P channel in the P channel region.

As an example, a thickness of the amorphous silicon layer is 200~2000 Å.

As an example, crystallizing the amorphous silicon layer into the poly-silicon layer comprises dehydrogenating and laser irradiation.

As an example, the boron atoms are implanted using a gas mixture of $B_2H_6$ and $H_2$ or $BF_3$ and $H_2$.

As an example, the phosphorus atoms are implanted using a gas mixture of $PH_3$ and $H_2$ or $PCl_3$ and $H_2$.

As an example, the method further comprises forming a buffer layer with a thickness of 100~4000 Å on the substrate before forming the amorphous silicon layer.

As an example, forming the gate electrode comprises:

forming a gate insulating layer, and forming one or more layers of metal or alloy on the gate insulating layer, and etching the metal layers to form the gate electrode.

As an example, forming the ohmic contact layers comprises:

performing photolithography on the gate metal layer and then performing N type light doping by using the photolithographed gate electrode as a mask, thereby forming light doped regions in the N channel and the P channel; and implanting boron atoms into the light doped region in the P channel by using the gate electrode above the P channel as a mask, thereby forming the P channel ohmic contact layer in the light doped region in the P channel; and implanting phosphorus atoms into the light doped region in the N channel to perform heavy doping, thereby forming the N channel ohmic contact layer in the light doped region in the N channel.

As an example, the method further comprises blocking the whole region of the N channel when implanting boron atoms into the light doped region in the P channel to perform heavy doping by using the gate electrode above the P channel as a mask thereby forming the P channel ohmic contact layer in the light doped region in the P channel, so as to block the boron atoms from being implanted into the whole region of the N channel.

As an example, the method further comprises blocking a part of region of the N channel and the whole region of the P channel when implanting phosphorus atoms into the light doped region in the N channel to perform heavy doping thereby forming the N channel ohmic contact layer in the light doped region in the N channel, so as to block the phosphorus atoms from being implanted into the blocked regions.

As an example, the part of the region of the N channel being blocked has an area larger than an area of the gate electrode but small than the whole area of the N channel.

As an example, forming source and drain electrodes comprises:

forming an interlayer insulating layer; and fabricating at least two contact holes in the interlayer insulating layer, the contact holes respectively extend to the P channel ohmic contact layer and the N channel ohmic contact layer;

sequentially forming one or more layers of metal or alloy on the interlayer insulating layer having the contact holes, and etching the one or more layers of metal or alloy to form the source and drain electrodes.

A second aspect of the invention provides a method for fabricating an array substrate comprising the afore-described method for fabricating a CMOS transistor, the method for fabricating an array substrate further comprises:

forming a passivation layer and fabricating at least two via holes on the passivation layer, the via holes respectively extend to the source and drain electrodes of the CMOS transistor; and forming a transparent conductive layer on the passivation layer having the via holes and forming a transparent pixel electrode above the P channel and a transparent pixel electrode above the N channel through a single photolithography.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the embodiments of the invention a regular top-gate configuration is used, where poly-silicon is first formed on the whole panel, and then doped to form a P channel; after that a half-tone/gray-tone process and an inverse implantation process of a single patterning is used to form a poly-silicon pattern and an N channel. In the following, the embodiments of the invention will be described in detail with reference to the drawings.

Embodiment 1

Figure 1:
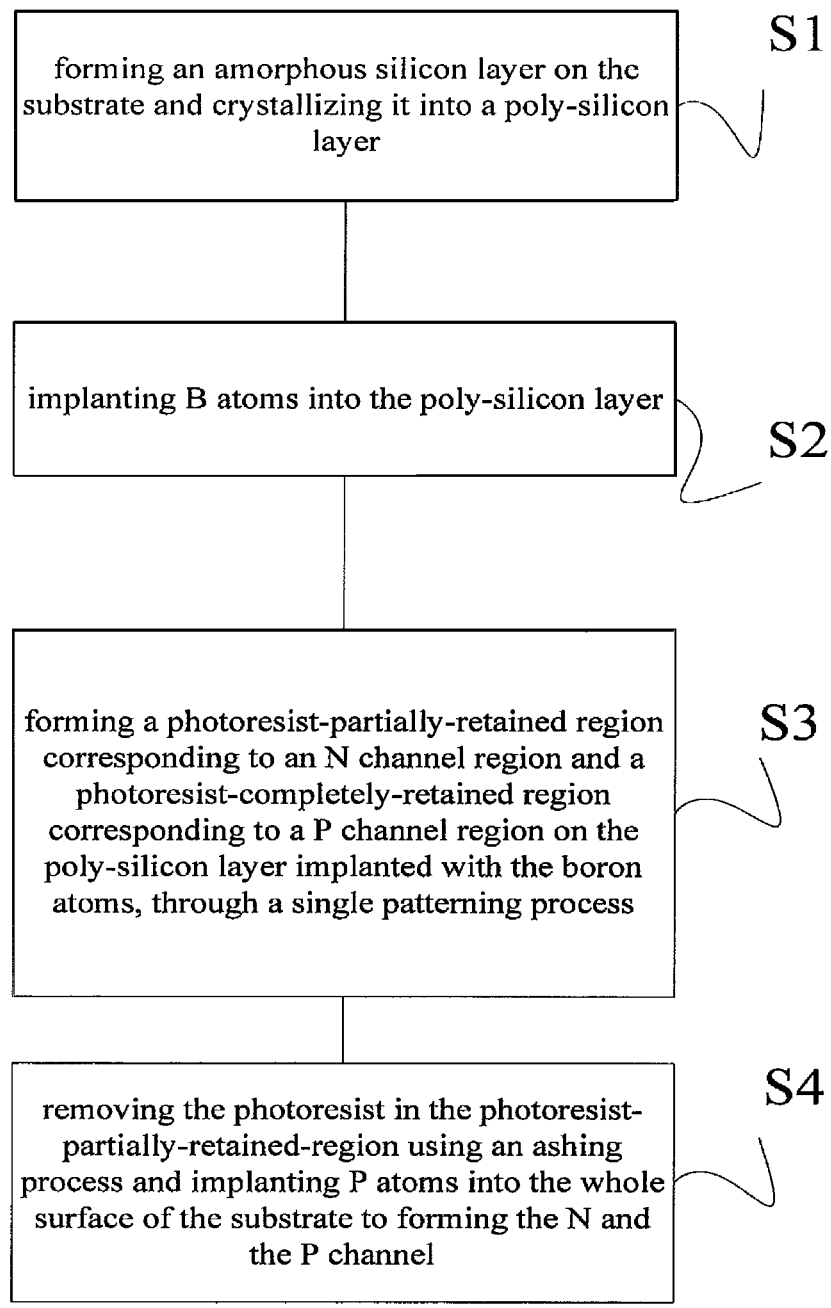
FIG. 1 schematically illustrates a flow chart of fabricating N, P channels in a CMOS transistor in accordance with an embodiment of the invention.

With reference to FIG. 1, the embodiment provides a method for fabricating a CMOS transistor, the method comprises forming channels, a gate electrode, ohmic contact layers and source and drain electrodes on a substrate, wherein the step of forming channels comprises:

S1: forming (please note that in all the embodiments of the invention methods for forming a film layer may be for example deposition, sputtering, spin-coating and other conventional methods in the field) an amorphous silicon layer with a preferable thickness of 200~2000 Å on a substrate 1 (such as a transparent glass substrate or a quartz substrate), and then crystallizing the amorphous silicon layer into a poly-silicon layer. The crystallization process may further comprise dehydrogenating the amorphous silicon and using laser irradiation and the like to crystallize the amorphous silicon layer into the poly-silicon layer 3.

Figure 3:
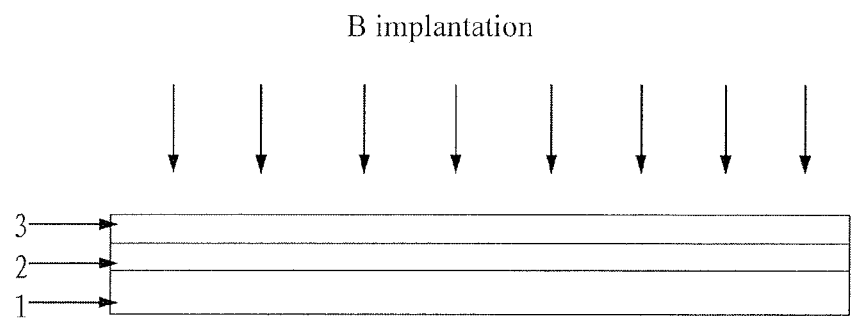
FIG. 3 schematically illustrates implanting baron atoms into a poly-silicon layer.

S2: as illustrated in FIG. 3, implanting boron atoms into the poly-silicon layer 3, where gases used for ion implantation may be the mixed gas of $B_2H_6$ and $H_2$, or the mixed gas of $BF_3$ and $H_2$.

Figure 4:
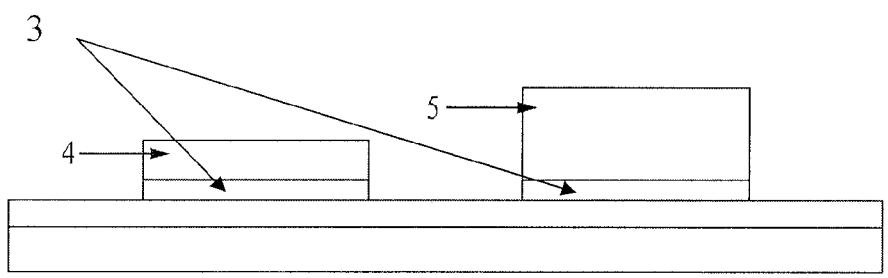
FIG. 4 schematically illustrates patterning on a poly-silicon layer to form a half-tone/gray-tone region (photoresist-partially-retained-region) and a full-tone region (photoresist-completely-retained-region)

S3: as illustrated in FIG. 4, forming a photoresist-partially-retained region 4 corresponding to an N channel region and a photoresist-completely-retained region 5 corresponding to a P channel region on the poly-silicon layer 3 implanted with the boron atoms, through a single patterning process.

Here, forming the photoresist-partially-retained region 4 and the photoresist-completely-retained region 5 through a single patterning process may be done in the following way: firstly, a photoresist-partially-retained region, a photoresist-completely-retained region and a photoresist-completely-removed-region are formed by exposing and developing processes using a half-tone mask or a gray-tone mask, then the poly-silicon layer in the photoresist-completely-removed-region is etched to form the configuration of FIG. 4.

Figure 5:
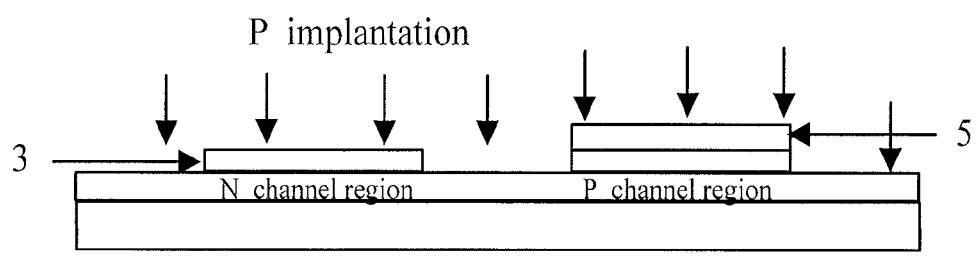
FIG. 5 schematically illustrates implanting phosphorus atoms into an N channel region.

S4: removing the photoresist in the photoresist-partially-retained-region and retaining a part of the photoresist in the photoresist-completely-retained region using an ashing process, implanting phosphorus atoms into the whole surface of the substrate through ion implantation, where gases used for ion implantation may be the mixed gas of $PH_3$ and $H_2$ or $PCl_3$ and $H_2$. With reference to FIG. 5, as the poly-silicon layer 3 in the N channel region is exposed, the N channel is formed by means of inverse implantation. In contrast, the poly-silicon layer 3 in the P channel region is covered by the photoresist which blocks the implantation of the phosphorus atoms, the P channel is thus formed.

With the method of the embodiment, the poly-silicon pattern and the N channel can be formed through the half-tone/gray-tone mask of a single patterning process and the inverse implantation, thereby reducing the complexity of the LIPS process and the cost of display devices based on the LIPS process.

Optionally, before forming the amorphous silicon layer (that is before step 1), a buffer layer 2 may be formed on the substrate 1 (i.e. in step S0). For example, a buffer layer 2 with a thickness of for example 100~4000 Å may be formed via PECVD and the buffer layer 2 may have a laminated structure of for example $SiN_x/SiO_2$ or be made of $SiO_2$.

Figure 2:
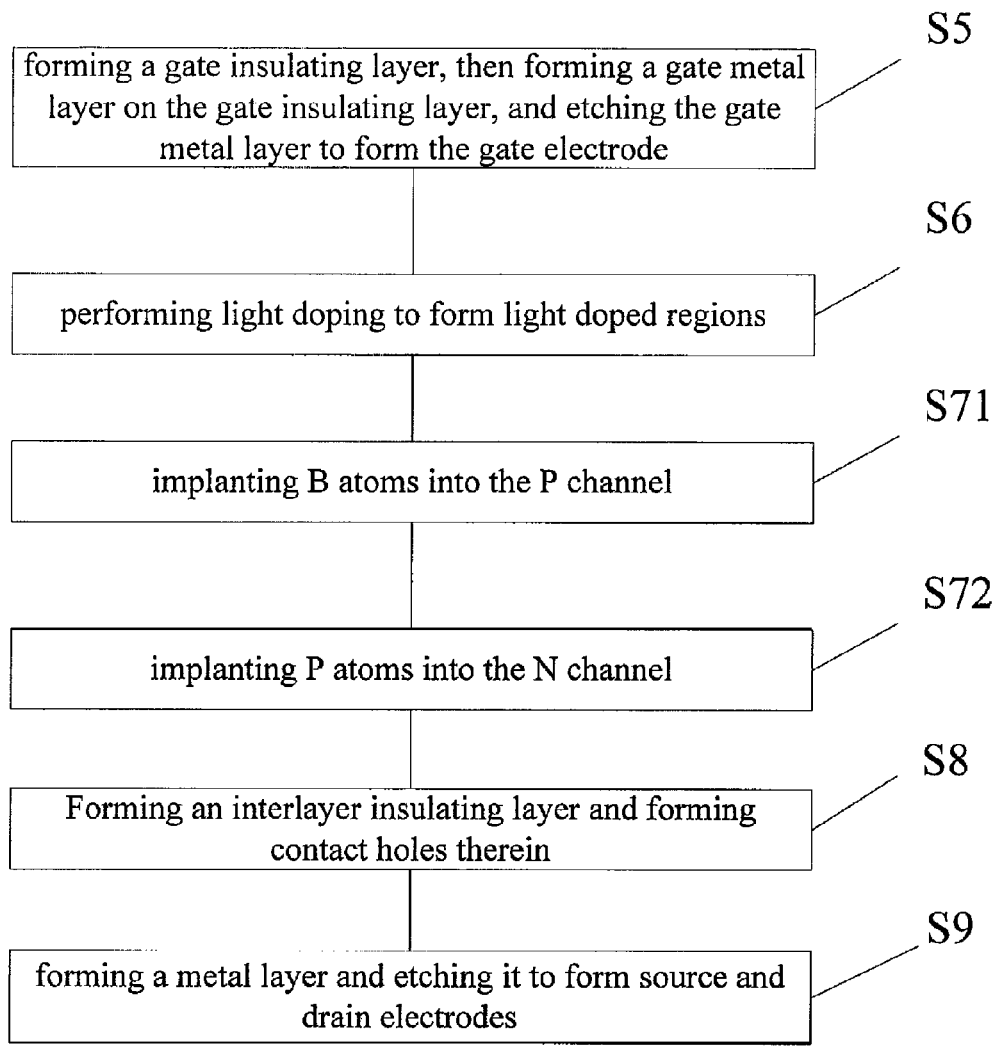
FIG. 2 schematically illustrates a flow chart of fabricating a CMOS transistor in accordance with another embodiment of the invention.

As illustrated in FIG. 2, optionally, the step of forming the gate electrode may comprise:

S5: forming a gate insulating layer with a thickness of for example 500~10000 Å by means of for example PECVD, the gate insulating layer may use $SiN_x/SiO_2$ or $SiO_2$; then forming one or more layers of metal or alloy (collectively referred to as the metal layer thereafter) using for example sputtering or thermal evaporation, and etching the metal layer to form the gate electrode 7. The metal may be at least one of Al, Ta, Cr, Mo and alloy thereof, with a thickness of preferably 1000~5000 Å.

Figure 6:
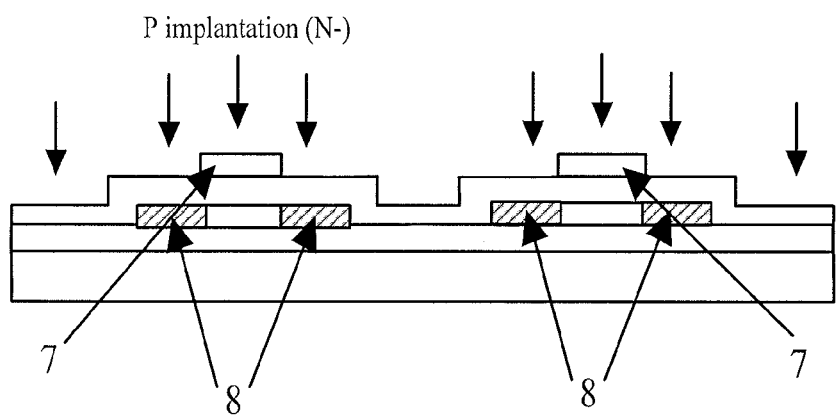
FIG. 6 schematically illustrates performing N-type light doping by using a gate electrode as a mask.

Optionally, the step of forming the ohmic contact layers may comprises:

S6: performing N type light doping by using the gate electrode 7 as the mask, thereby respectively forming two light doped regions 8 as illustrated in FIG. 6 in the N channel and the P channel.

Figure 7:
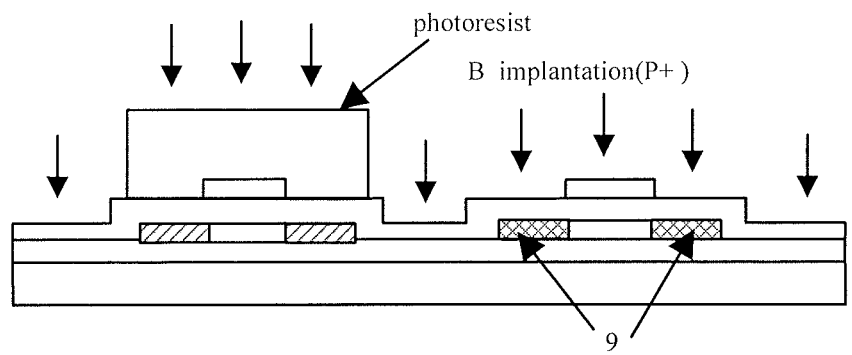
FIG. 7 schematically illustrates performing heavy doping by implanting boron atoms using ion implantation.
Figure 8:
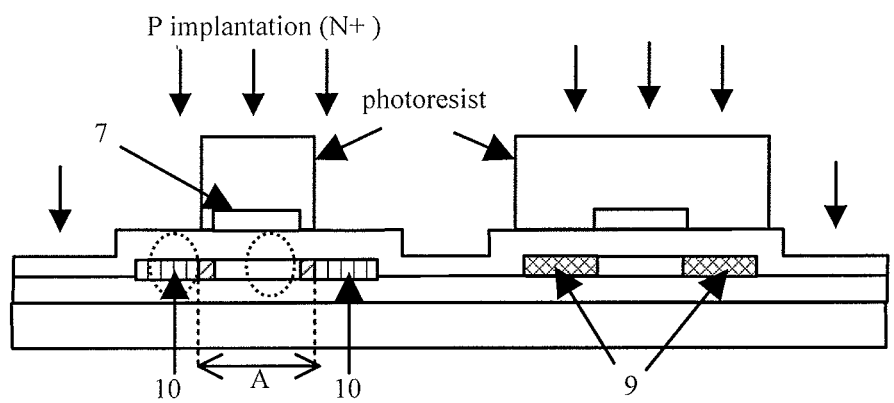
FIG. 8 schematically illustrates performing heavy doping by implanting phosphor atoms using ion implantation.

S7: as illustrated in FIG. 7, implanting boron atoms into the light doped regions 8 in the P channel by using the gate electrode 7 on the right side of FIG. 7 as the mask and performing heavy doping (sub-step S71), the gases used for ion implantation may be the mixed gas of $B_2H_6$ and $H_2$, or $BF_3$ and $H_2$; thereby turning the light doped regions 8 in the P channel into a P channel ohmic contact layer 9. While performing the above ion implantation, the whole region of the N channel should be blocked by the photoresist such that boron atom implantation into this region is blocked. As illustrated in FIG. 8, the step S7 may further comprise implanting phosphorus atoms into the light doped regions 8 in the N channel and performing heavy doping (sub-step S72), thereby turning the light doped regions 8 in the N channel into an N channel ohmic contact layer 10; the gases used for ion implantation may be the mixed gas of $PH_3$ and $H_2$, or $PCl_3$ and $H_2$. While performing the ion implantation, a part of the region (denoted as region "A" in FIG. 8) in the N channel and the whole region of the P channel should be blocked by the photoresist such that ion implantation into these regions is blocked. Here the part of the region in the N channel contains a region in the N channel corresponding to the gate electrode and its immediate neighboring regions, an area of the region "A" (in FIG. 8 it may be considered as a width) being larger than that of the gate electrode 7 while smaller than that of the N channel. The purpose of having such a region in the N channel is to leave two light doped sub-regions (as indicated by the dotted circle in FIG. 8) in the inner side of the N channel ohmic contact layer 10, which is configured for decreasing the drain current and reducing the contact resistance, and is therefore arranged in the N channel only while not in the P channel.

Please note that when ion implantation is performed blocking via the photoresist is used to selectively perform ion implantation in some of the regions. The photoresist pattern for blocking is formed via exposing and developing using a mask before implanting ions. It is also possible to block ion implantation using the mask directly without forming the photoresist pattern.

Figure 9:
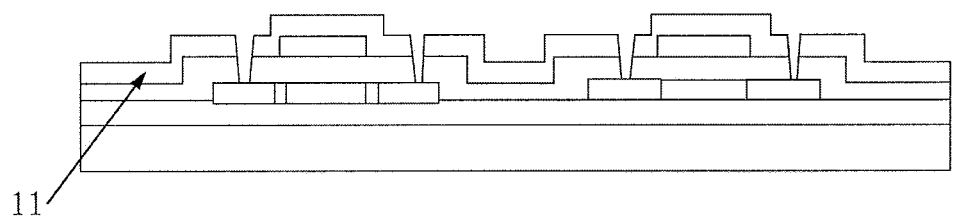
FIG. 9 illustrates a cross section of a CMOS transistor after forming an interlayer insulating layer and forming contact holes in the interlayer insulating layer.

Optionally, the step of forming the source and drain electrodes comprises:

S8: forming an interlayer insulating layer 11 with a thickness of 500~10000 Å via for example PECVD, the interlayer insulating layer 11 may be $SiO_2/SiN_x$ or $SiO_2$; then fabricating at least two contact holes, such as 4 contact holes, in the interlayer insulating layer as illustrated in FIG. 9, where two contact holes extend to and expose the P channel ohmic contact layer, the other two contact holes extend to and expose the N channel ohmic contact layer.

S9: sequentially forming a metal layer 12 with a single or multiple layer structure and a thickness preferably of 1000~5000 Å on the interlayer insulating layer having the contact holes, by means of for example sputtering or thermal evaporation, such that the metal layer respectively overlays the exposed P channel ohmic contact layer and the exposed N channel ohmic contact layer; and then etching the metal layer to form a signal line and source and drain electrodes. Here the metal may be at least one of Al, Ta, Cr, Mo or an alloy thereof.

Embodiment 2

The embodiment further provides a method for fabricating an array substrate, the method comprises every step of the method for fabricating the CMOS transistor in accordance with the above embodiment as well as the following steps:

S10: forming a passivation layer 13 with a thickness of preferably 700~6000 Å by using for example PECVD and forming at least two via holes on the passivation layer, the via holes respectively extend to and exposes the source and drain electrodes of the CMOS transistor.

Figure 10:
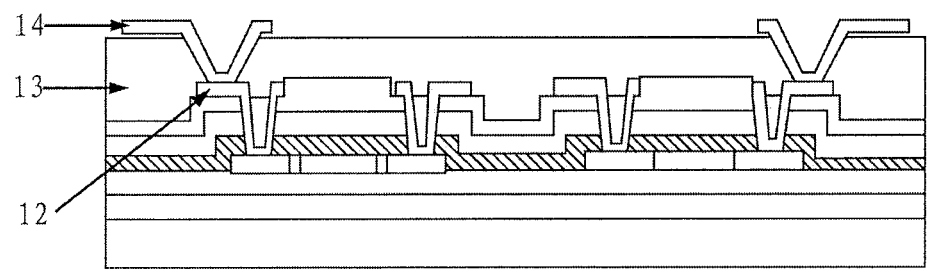
FIG. 10 illustrates a cross section of a CMOS transistor after forming a transparent conductive layer and forming a transparent pixel electrode on the transparent conductive layer.

S11: forming a transparent conductive layer, which is normally ITO or IZO or other transparent conductive material with a thickness of for example 300~1000 Å, on the passivation layer having the via holes by using for example sputtering or thermal evaporation, and forming transparent pixel electrodes 14 through a single patterning process. There are two pixel electrodes 14 which respectively locate above the P channel region and the N channel region. A cross section of the array substrate is illustrated in FIG. 10.

Embodiment 3

The embodiment further provides a CMOS transistor comprising a substrate and channels, a gate electrode, ohmic contact layers and source and drain electrodes formed on the substrate; the CMOS transistor may further comprises a poly-silicon layer formed on the substrate, wherein the poly-silicon layer is implanted by boron atoms so as to form an N channel region and a P channel region. A photoresist-partially-retained region is disposed on the N channel region and a photoresist-completely-retained region is disposed on the P channel region, the photoresist in the photoresist-partially-retained region is completely removed and the photoresist in the photoresist-completely-retained region is partially removed such that phosphorus atoms are implanted into the N channel region and the N channel and the P channel are formed in the poly-silicon layer.

Optionally, a gate insulating layer and a metal layer with a single or multiple layer structure are sequentially disposed on the P channel and the metal layer is etched to form the gate electrode.

Optionally, the gate electrode is used as a mask for N type light doping, thereby respectively forming a light doping region in the N channel region and the P channel region.

Optionally, the N channel region comprises an N channel ohmic contact layer formed by implanting phosphorus atoms into the N channel region by using the mask, and the P channel region comprises a P channel ohmic contact layer formed by implanting boron atoms into the P channel region by using the mask.

Optionally, an interlayer insulating layer is disposed on the metal layer, and at least two contact holes are disposed in the interlayer insulating layer, the contact holes respectively extend to the P channel ohmic contact layer and the N channel ohmic contact layer.

Optionally, a metal layer with a single or multiple layer structure is disposed on the interlayer insulating layer, a passivation layer is disposed on the metal layer, and via holes extending to the metal layer above the interlayer insulating layer are formed in the passivation layer, an N channel side transparent conductive electrode and a P channel side transparent conductive electrode are disposed on the passivation layer.

The embodiment further provides an array substrate comprising the afore-mentioned CMOS transistor.

The embodiment further provides a CMOS device comprising the above array substrate.

The embodiment further provides a TFT-based LCD comprising the above array substrate.

In the methods for fabricating the CMOS transistor and array substrate in accordance with the embodiments of the invention, a single patterning process is used to form the P and N channel, thereby reducing the LTPS complexity, achieving the technical effect of reducing one patterning process and saving fabrication cost of the display devices.

What are described above is related to the illustrative embodiments of the disclosure only and not limitative to the scope of the disclosure; the scopes of the disclosure are defined by the accompanying claims.

What is claimed is:

1. A method for fabricating a CMOS transistor comprising: forming channels, a gate electrode, ohmic contact layers and source and drain electrodes on a substrate, wherein forming channels comprises:
    forming an amorphous silicon layer on the substrate, and crystallizing the amorphous silicon layer into a poly-silicon layer;
    implanting boron atoms into the poly-silicon layer;
    forming a photoresist-partially-retained region corresponding to an N channel region and a photoresist-completely-retained region corresponding to a P channel region on the poly-silicon layer implanted with the boron atoms through a single patterning process; and
    removing the photoresist in the photoresist-partially-retained-region and retaining a part of the photoresist in the photoresist-completely-retained region using an ashing process, implanting phosphorus atoms through ion implantation, thereby forming an N channel in the N channel region and forming a P channel in the P channel region.

2. The method of claim 1, wherein a thickness of the amorphous layer is 200~2000 Å.

3. The method of claim 1, wherein crystallizing the amorphous silicon layer into the poly-silicon layer comprises dehydrogenating and laser irradiation.

4. The method of claim 1, wherein the boron atoms are implanted using a gas mixture of $B_2H_6$ and $H_2$ or $BF_3$ and $H_2$.

5. The method of claim 1, wherein the phosphorus atoms are implanted using a gas mixture of $PH_3$ and $H_2$ or $PCl_3$ and $H_2$.

6. The method of claim 1, wherein the method further comprises forming a buffer layer with a thickness of 100~4000 Å on the substrate before forming the amorphous silicon layer.

7. The method of claim 1, wherein forming the gate electrode comprises:
    forming a gate insulating layer, then forming one or more layers of metal or alloy on the gate insulating layer, and etching the metal layer to form the gate electrode.

8. The method of claim 7, wherein forming the ohmic contact layer comprises:
    performing photolithography on the gate metal layer and then performing N type light doping by using the photolithographed gate electrode as a mask, thereby forming light doped regions in the N channel and the P channel; and
    implanting boron atoms into the light doped regions in the P channel by using the gate electrode above the P channel as a mask to perform heavy doping, thereby forming a P channel ohmic contact layer in the light doped regions of the P channel; and implanting phosphorus atoms into the light doped regions in the N channel to perform heavy doping, thereby forming an N channel ohmic contact layer in the light doped regions of the N channel.

9. The method of claim 8, wherein the method further comprises blocking the whole region of the N channel when implanting boron atoms into the light doped regions in the P channel to perform heavy doping by using the gate electrode on the P channel as a mask thereby forming the P channel ohmic contact layer in the light doped regions in the P channel, so as to block the boron atoms from being implanted into the whole region of the N channel.

10. The method of claim 8, wherein the method further comprises blocking a part of region in the N channel and the whole region in the P channel when implanting phosphorus atoms into the light doped regions in the N channel to perform heavy doping thereby forming the N channel ohmic contact layer in the light doped regions in the N channel, so as to block the phosphorus atoms from being implanted into the blocked regions.

11. The method of claim 10, wherein an area of the part of region in the N channel being blocked is larger than an area of the gate electrode but small than the whole area of the N channel.

12. The method of claim 8, wherein the boron atoms are implanted using a gas mixture of $B_2H_6$ and $H_2$ or $BF_3$ and $H_2$.

13. The method of claim 8, wherein the phosphorus atoms are implanted using a gas mixture of $PH_3$ and $H_2$ or $PCl_3$ and $H_2$.

14. The method of claim 8, wherein forming the source and drain electrodes comprises:
    forming an interlayer insulating layer, and fabricating at least two contact holes in the interlayer insulating layer, the contact holes respectively extend to the P channel ohmic contact layer and the N channel ohmic contact layer;
    sequentially forming one or more layers of metal or alloy on the interlayer insulating layer having the contact holes, and etching the one or more layers of metal or alloy to form source and drain electrodes.

15. A method for fabricating an array substrate comprising the method for fabricating a CMOS transistor of claim 1, the method for fabricating an array substrate further comprises:
    forming a passivation layer and fabricating at least two via holes on the passivation layer, the via holes respectively extend to the source and drain electrodes of the CMOS transistor; and
    forming a transparent conductive layer on the passivation layer having the via holes and forming a transparent pixel electrode above the P channel and a transparent pixel electrode above the N channel through a single photolithograph.

* * * * *